(12) United States Patent
Baum

(10) Patent No.: US 7,335,239 B2
(45) Date of Patent: Feb. 26, 2008

(54) CHEMICAL MECHANICAL PLANARIZATION PAD

(75) Inventor: Thomas H. Baum, New Fairfield, CT (US)

(73) Assignee: Advanced Technology Materials, Inc., Danbury, CT (US)

( * ) Notice: Subject to any disclaimer, the term of this patent is extended or adjusted under 35 U.S.C. 154(b) by 204 days.

(21) Appl. No.: 10/715,246

(22) Filed: Nov. 17, 2003

(65) Prior Publication Data

US 2005/0106880 A1    May 19, 2005

(51) Int. Cl.
C09K 3/14 (2006.01)
B24D 11/00 (2006.01)
H01L 21/461 (2006.01)
H01L 21/302 (2006.01)

(52) U.S. Cl. .......................... 51/298; 451/533; 438/690; 438/691; 438/693

(58) Field of Classification Search .................. None
See application file for complete search history.

(56) References Cited

U.S. PATENT DOCUMENTS

| | | | | |
|---|---|---|---|---|
| 3,736,295 A | * | 5/1973 | Meckel et al. | 528/66 |
| 4,395,528 A | * | 7/1983 | Leiner et al. | 528/45 |
| 4,701,488 A | * | 10/1987 | Williams | 524/266 |
| 5,578,362 A | * | 11/1996 | Reinhardt et al. | 428/147 |
| 5,934,980 A | | 8/1999 | Koos et al. | |
| 6,124,380 A | * | 9/2000 | Bossert et al. | 523/404 |
| 6,290,883 B1 | * | 9/2001 | Crevasse et al. | 264/50 |
| 6,337,281 B1 | | 1/2002 | James et al. | |
| 6,354,929 B1 | | 3/2002 | Adefris et al. | |
| 6,477,926 B1 | | 11/2002 | Swisher et al. | |
| 6,910,951 B2 | * | 6/2005 | Balijepalli et al. | 451/41 |
| 6,913,517 B2 | * | 7/2005 | Prasad | 451/41 |
| 2002/0004357 A1 | | 1/2002 | Baker et al. | |
| 2003/0217517 A1 | * | 11/2003 | Allison et al. | 51/298 |
| 2004/0166790 A1 | * | 8/2004 | Balijepalli et al. | 451/526 |

OTHER PUBLICATIONS

Advanced Technology Materials, Inc., "Notification of Transmittal of the International Search Report and the Written Opinion of the International Search Authority, or the Declaration," Feb. 15, 2006.

* cited by examiner

Primary Examiner—Duy-Vu N Deo
(74) Attorney, Agent, or Firm—Chih-Sheng (Jason) Lin; Tristan A. Fuierer; Moore & Van Allen PLLC

(57) ABSTRACT

A Chemical Mechanical Planarization (CMP) Pad. The CMP pad may be hydrophobic due to the incorporation of metal complexing agents. The CMP pad substantially retaining planarazation characteristics throughout planarization applications. Shearing, hardness, wearing, water absorbtion and electrical characteristics of the CMP pad remain substantially constant during CMP applications.

24 Claims, 6 Drawing Sheets

CHEMICAL MECHANICAL PLANARIZATION PAD

BACKGROUND

Embodiments described relate to Chemical Mechanical Planarization (CMP) Pads. In particular, embodiments relate to CMP Pads which display substantially resilent character throughout CMP applications.

BACKGROUND OF THE RELATED ART

In the fabrication of semiconductor devices, materials of varying purposes are deposited on a semiconductor substrate. The semiconductor substrate is often a wafer of monocrystaline silicon materials having oxide layers such as silicon dioxide. Materials deposited thereon may include copper, aluminum and other metals to form metal lines within trenches of the semiconductor substrate. Additional circuit features and material layers may be formed on the semiconductor substrate throughout the fabrication process. A process of chemical mechanical planarization (CMP) follows the deposition of materials on the substrate in order to ensure that circuit features, such as the described metal lines, are discrete and isolated within the semiconductor substrate.

The CMP process may involve removing unwanted portions of deposited materials on the semiconductor substrate in order to planarize and isolate circuit features as described above. Planarization of the semiconductor substrate ensures a smooth and uniform surface thereon for subsequent material depositions and device fabrication. CMP is generally achieved by application of a CMP pad to the surface of the semiconductor substrate. The CMP pad, in combination with an aqueous slurry, are of particular chemical and mechanical properties configured to planarize the semiconductor substrate as the CMP pad is driven across the surface thereof.

A CMP pad is generally of a polyurethane or other flexible organic polymer. The particular characteristics of the CMP pad are key in developing the CMP process to be employed. For example, factors such as hardness, porosity, and rigidity of the CMP pad and its surface are taken into account when developing a particular CMP process for planarization of a particular semiconductor surface. In this manner, the CMP process may be precisely tailored for the type and amount of material to be planarized from the semiconductor surface.

Unfortunately, wear, hardness and other characteristics of the CMP pad may change over the course of a given CMP process. This is due in part to water absorption as the CMP pad takes up some of the aqueous slurry when encountered at the wafer surface during CMP. This sponge-like behavior of the CMP pad leads to alteration of CMP pad characteristics, notably at the surface of the CMP pad. Altering the character of the CMP pad in this manner, makes a particular planarization process extremely difficult, if not entirely impossible, to establish with a high degree of precision.

DETAILED DESCRIPTION

Embodiments are described below with reference to certain Chemical Mechanical Planarization (CMP) pads and methods of making and using CMP Pads. In particular, hydrophobic CMP pads are described having resilent planarization characteristics. For example, embodiments of hydrophobic CMP pads may be employed in planarization applications while avoiding significant change in hardness, wear, water absorption, cross-link density, electrical, and other planarization characteristics.

Figure 1:
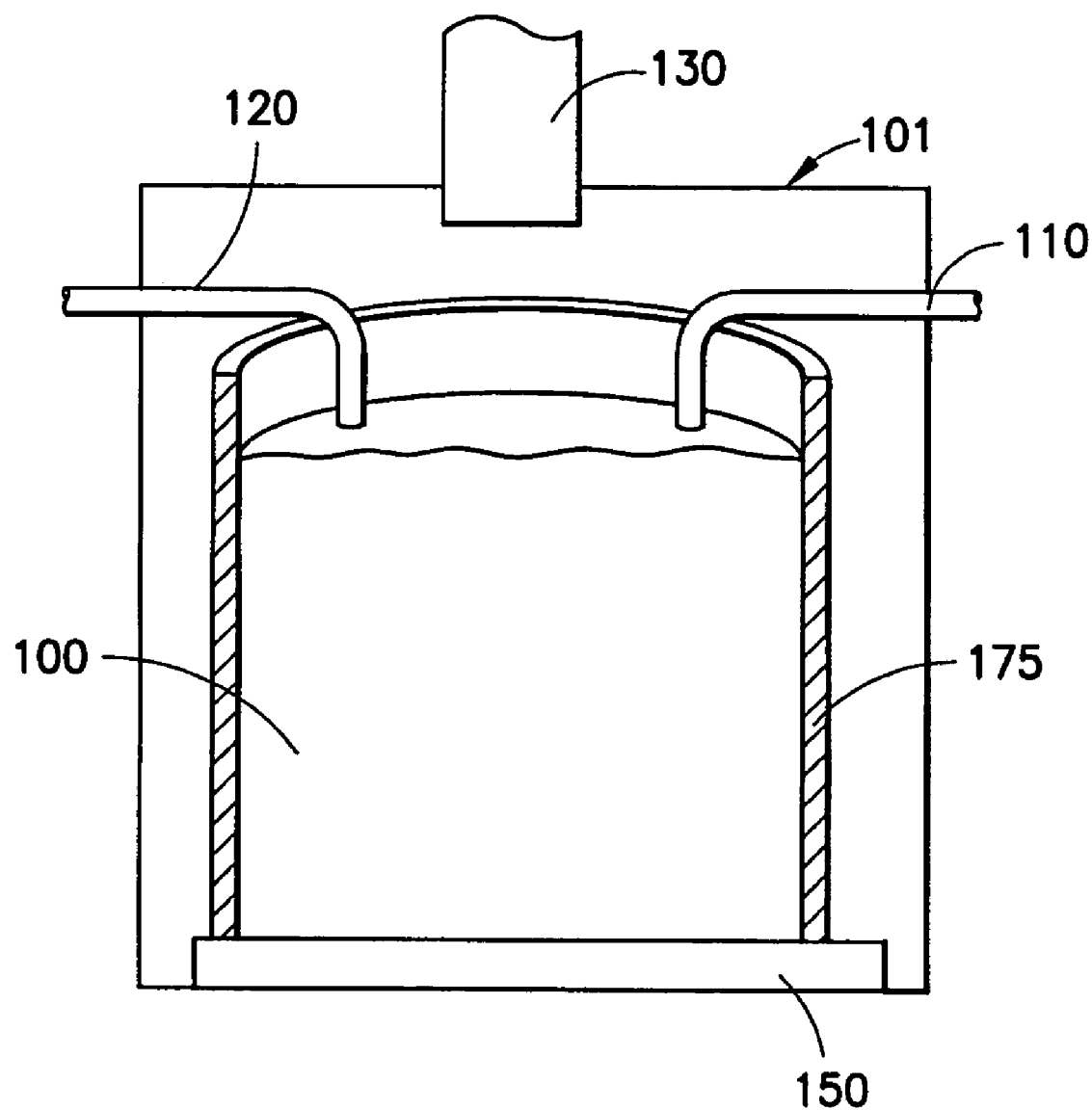
FIG. 1 is a cross-sectional perspective view of an embodiment of Chemical Mechanical Planarization (CMP) material formation.

Referring now to FIG. 1, an embodiment of a molding chamber 101 is shown having CMP material 100 therein. In the embodiment shown, the CMP material 100 includes an organic polymer which may initially be in the form of a polymer forming liquid provided by a polymer inlet 120. The CMP material 100 also includes a metal agent provided by way of an agent inlet 110. Additional additives and fillers may also be provided to tailor properties of the CMP material 100 as desired. In the embodiment shown, the molding chamber 101 also includes a mold container 175 for securing the CMP material 100. A heater 150 and a gas inlet 130 may also be provided as shown. These features may be employed, as described further below, in the formation of a CMP log 200 (see FIG. 2) from the liquid CMP material 100.

Figure 2:
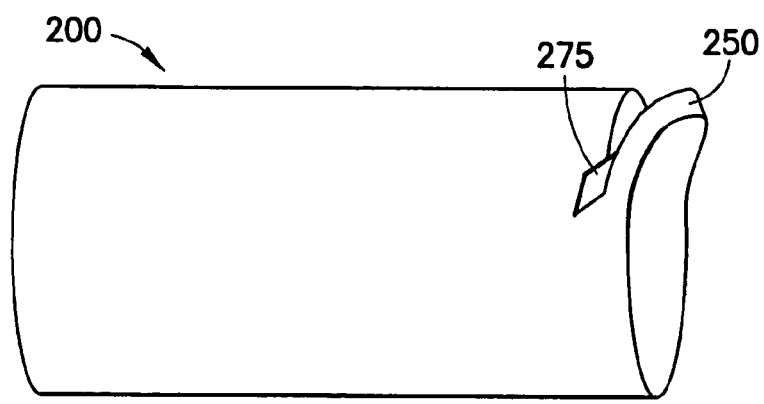
FIG. 2 is a side view of an embodiment of a CMP log formed of the CMP material of FIG. 1.
Figure 6:
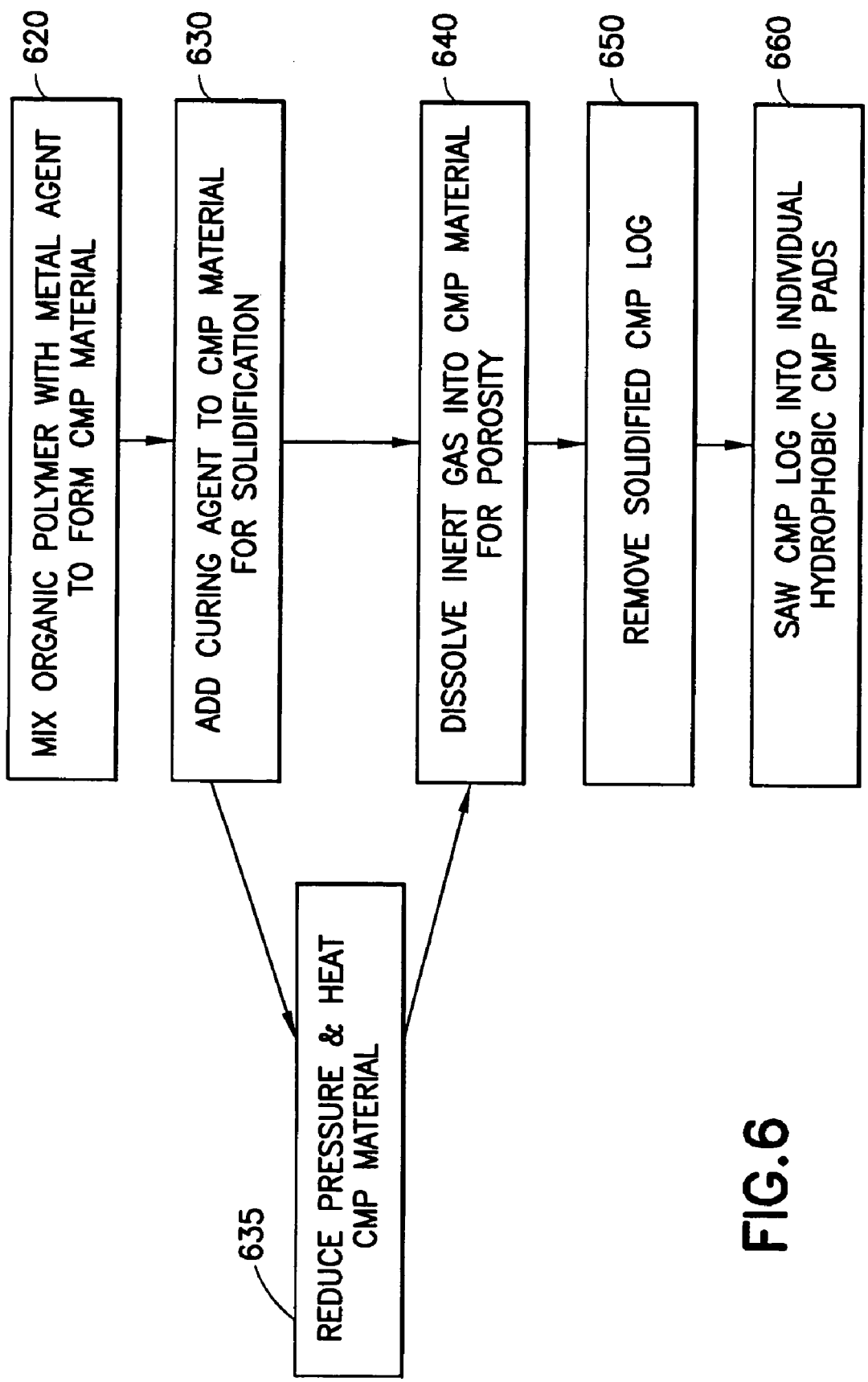
FIG. 6 is a flow-chart summarizing embodiments of forming a hydrophobic CMP pad.

With additional reference to FIG. 6, and embodiment of forming a hydrophobic CMP pad 250 as shown in FIG. 2. is summarized in the form of a flow-chart. FIG. 6 is referenced throughout portions of the description to follow as an aid in describing formation of a hydrophobic CMP pad 250.

Continuing with reference to FIGS. 1 and 6, the polymer forming liquid of the CMP material 100 may include a liquid urethane formed from a polyol and a di-isocyanate. The urethane may be polyether based. To encourage cross-linking as described below, the urethane selected may be reactive with a polyfunctional amine, diamine, triamine, a polyfunctional hydroxyl compound, and mixed functionality compounds including hydroxyl amines. In this manner, a polymer matrix may be formed as the CMP material 100 is later cured. A metal agent is also introduced via the agent inlet 110 and mixed with the organic polymer as indicated above and at 620. In this manner, the CMP material 100 is formed. The metal agent itself may induce further cross-linking. As described below, additional mechanisms may be employed such that a reaction takes place by which the CMP material 100 takes the form of the CMP log 200 as shown in FIG. 2.

In one embodiment, the CMP material 100 is delivered to the mold container 175 along with foaming and curing agents. Curing agents may be provided to the CMP material 100 as indicated at 630 via the agent inlet 110 such that the CMP material 100 takes the form of a solidifiable polyurethane foam. Metal agent such as that described above may be employed as a foaming agent. Polyurethane is often selected as a CMP material due to inherent shear, wear, and hardness characteristics.

To tailor the porosity of the foam to a desired level, an inert gas may be simultaneously introduced through a gas inlet 130 and dissolved within the CMP material 100 as indicated at 640. This may take place following addition of curing agent. Additionally, conditions within the molding chamber 101, such as pressure and temperature may be regulated during the curing of the CMP material 100. For example, in the embodiment shown, a heater 150 is provided to ensure that a desired temperature of the CMP material 100 is regulated during the curing process. In one embodiment, heat is applied to expedite the curing process as indicated at 635. As also indicated at 635, pressure may be reduced within the molding chamber 101. This may encourage curing in a manner that promotes a desired level of porosity.

Continuing with reference to FIG. 1, and as described above, a polymeric matrix may be formed by use of the selected materials. This matrix may be formed from urethanes as described, in addition to melamines, polyesters, polysulfones, polyvinyl acetates, fluorinated hydrocarbons, including mixtures and copolymers thereof. Additionally, a metal agent is introduced as the CMP material 100 is formed. Generally, the metal agent is organically soluble and delivered dissolved within an organic solvent. The metal agent aids in the cross-linking formation of a matrix which includes metal-polymer complexes. As described further herein, these complexes provide hydrophobicity and control over the resistivity of the final product. Thus, a hydrophobic CMP pad 250 (see FIG. 2) may be formed which is able to maintain a reliable character during planarization applications. That is, shear, hardness, wear, water absorption and other characteristics of a hydrophobic CMP pad 250 may be substantially and reliably maintained, including at the pad surface 475 throughout planarization applications (see FIG. 4).

Embodiments of metal agents which may be employed as described above include metal β-diketonates having structures such as that shown here:

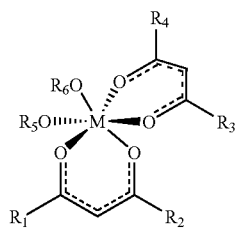

As shown above, M may be a divalent metal cation including Copper, Cobalt, Palladium, Nickel, and Zinc, or a tetravalent metal cation including Titanium, Zirconium, and Hafnium. Additionally, $R_1$, $R_2$, $R_3$, $R_4$, $R_5$ and $R_6$ may be any combination of Hydrogen, aryls, perfluoroaryls, alkyls, and perfluoroalkyls. However, other embodiments may also be employed, including derivatives of metal β-diketonates and Lewis base adducts. In one preferred embodiment, all of $R_1$-$R_6$ are t-butyl groups. These groups may be chosen to help limit isomerization reactions and instill a higher thermal stability to the organic polymer matrix formed. In another embodiment, all of $R_1$-$R_6$ are perfluoroalkyl groups.

Referring now to FIGS. 1, 2 and 6, the CMP material 100 is cured as described above and a solidified CMP log 200 is removed as indicated at 650, from the mold container 175 and chamber 101. A CMP saw 275 is used to saw individual hydrophobic CMP pads 250 from the CMP log 200. In this manner, a single CMP log 200 provides several hydrophobic CMP pads 250 as indicated at 660. A hydrophobic CMP pad 250 may then be treated, conditioned, and available for use in planarization (see FIGS. 3-5).

Figure 3:
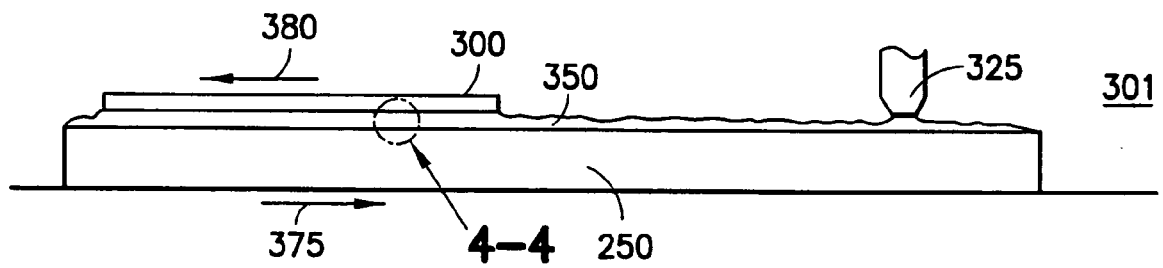
FIG. 3 is a side view of an embodiment of a hydrophobic CMP pad taken from the CMP log of FIG. 2 and applied to a semiconductor substrate.
Figure 4:
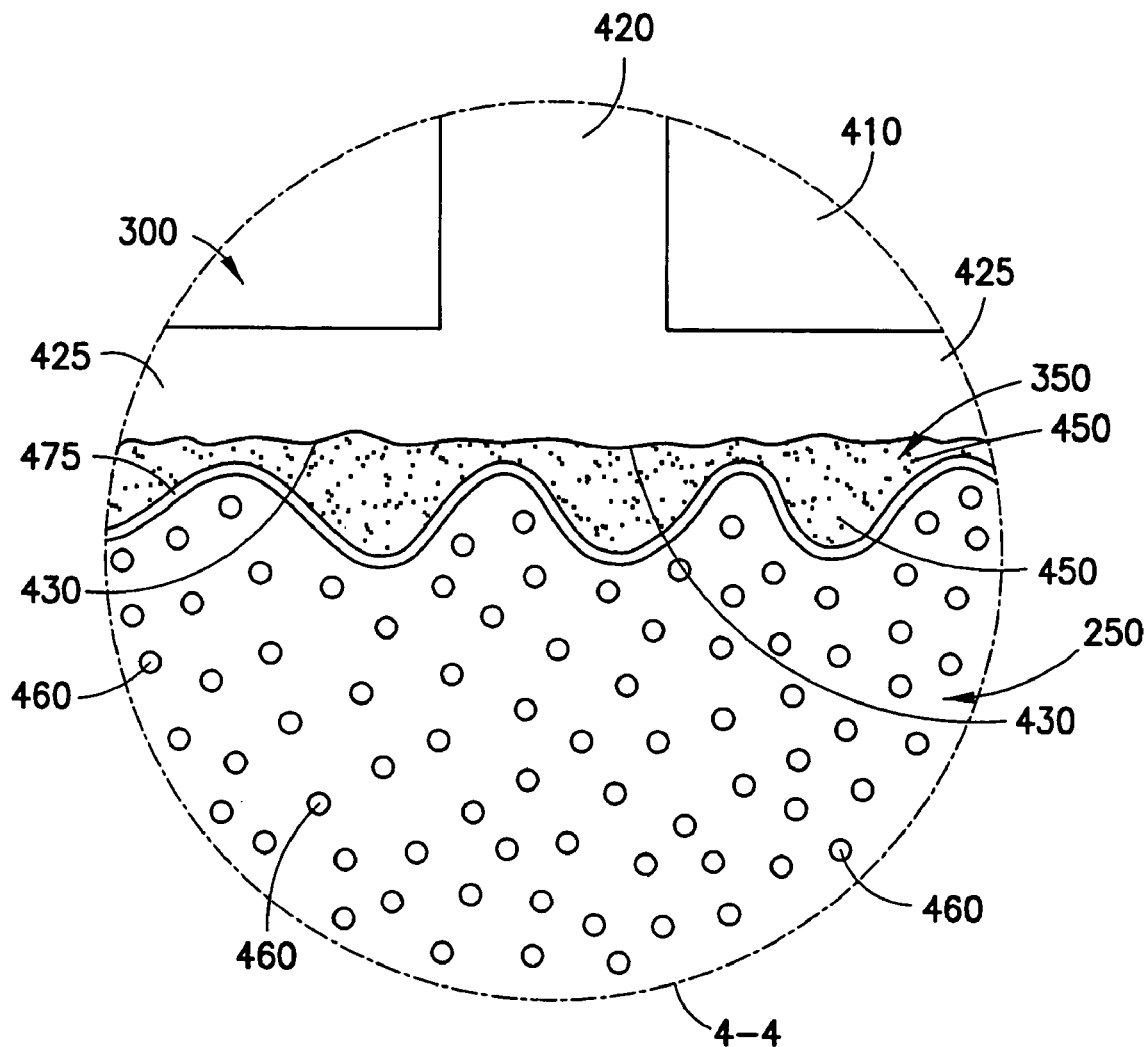
FIG. 4 is an exploded view of an embodiment of a hydrophobic CMP pad and semiconductor substrate taken from 4-4 of FIG. 3.
Figure 5:
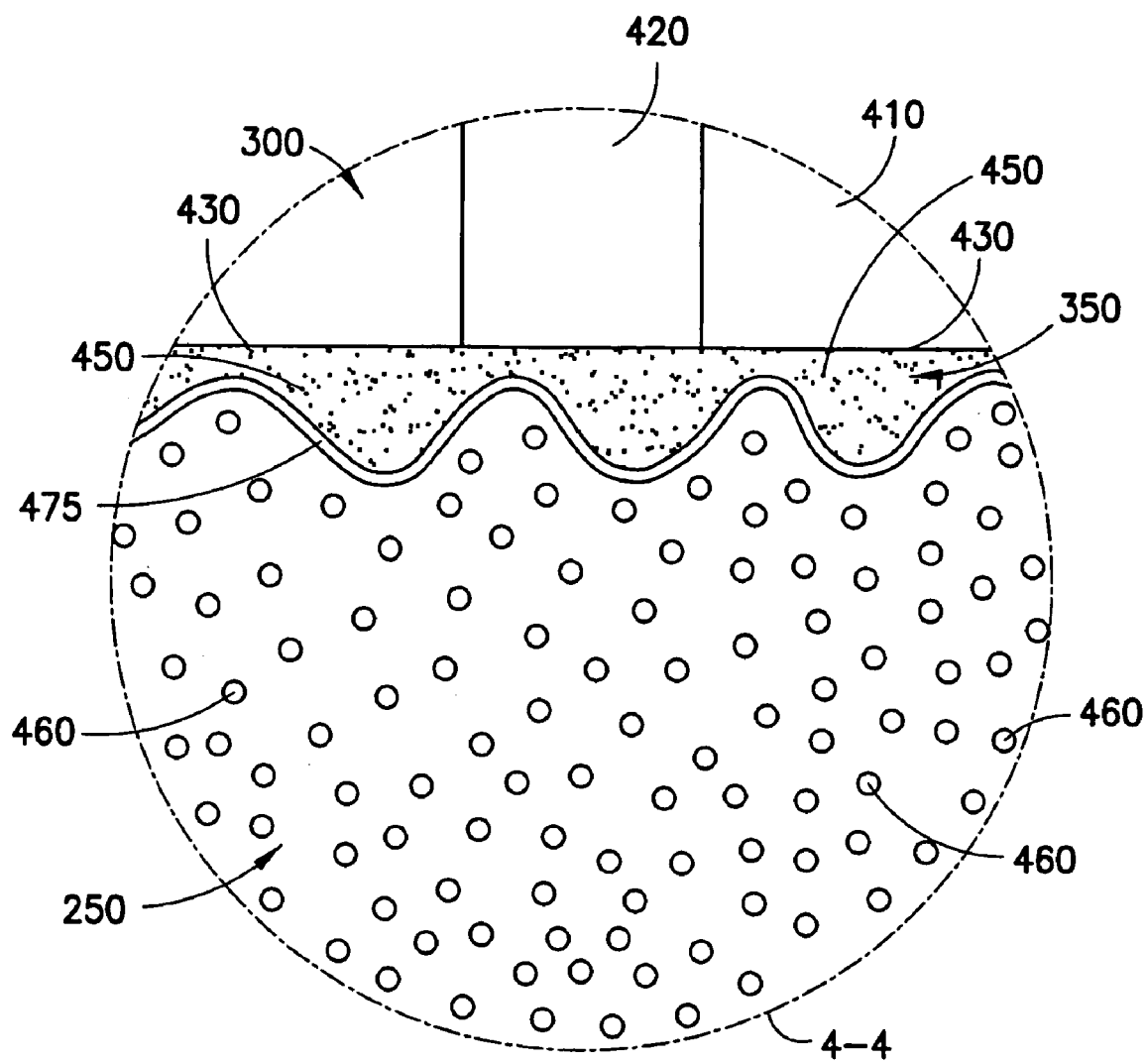
FIG. 5 is an exploded view of the hydrophobic CMP pad and semiconductor substrate of FIG. 4 following application of an embodiment of Chemical Mechanical Planarization.
Figure 7:
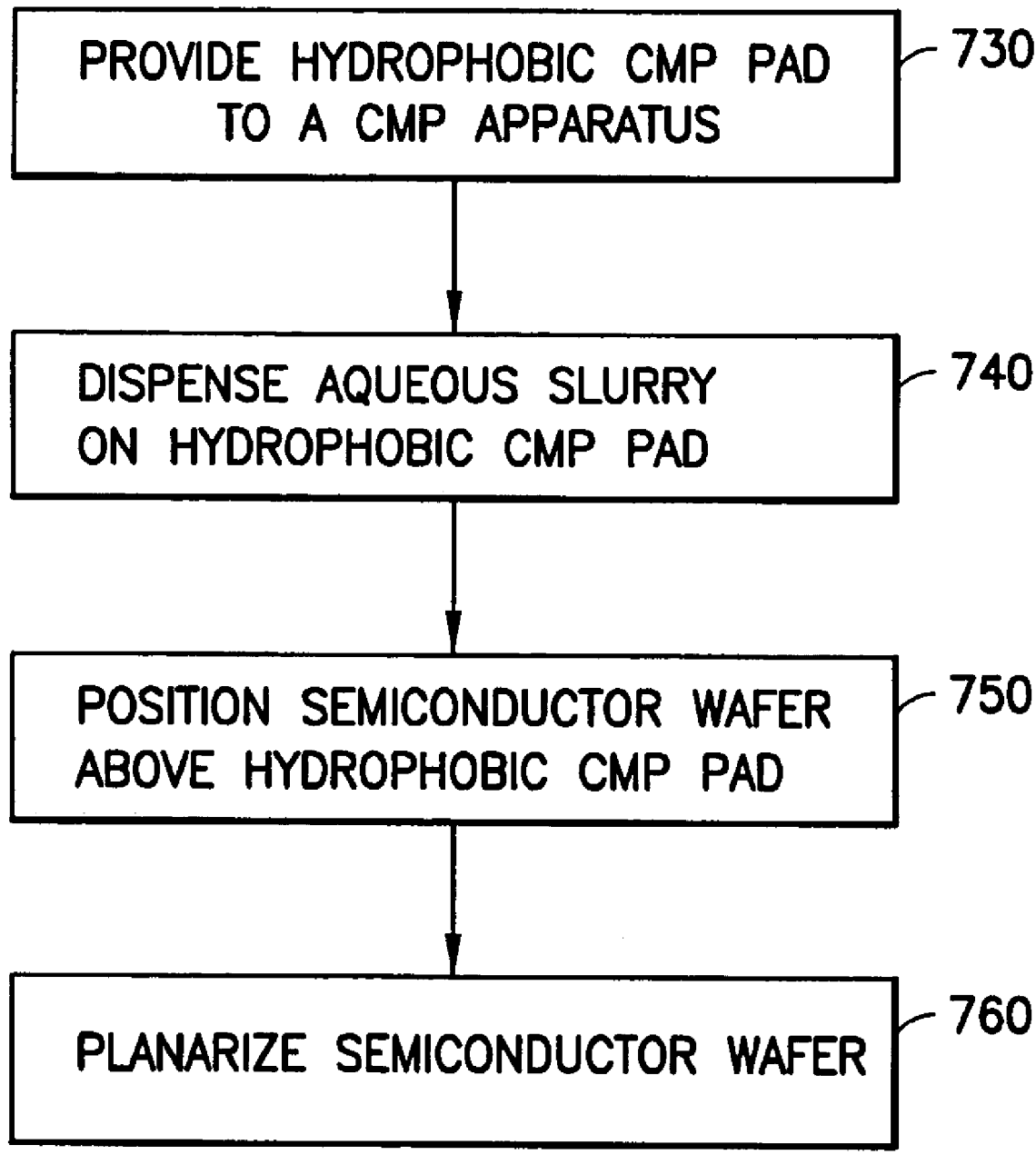
FIG. 7 is a flow-chart summarizing an embodiment of planarization with a hydrophobic CMP pad.

Referring to FIGS. 3-5, a hydrophobic CMP pad 250 is shown employed in a planarization process applied to a semiconductor wafer 300 FIG. 7, a flow-chart summarizing an embodiment of planarization, is also referenced herein as an aid in and indicated describing planarization. As shown in FIG. 3, and indicated at 730, the hydrophobic CMP pad 250 is positioned on a CMP apparatus 301. A dispenser 325 then delivers an aqueous slurry 350 to the surface 475 of the hydrophobic CMP pad 250 as indicated at 740. The semiconductor wafer 750 is positioned above the hydrophobic CMP pad 250 as indicated at 750. The aqueous slurry 350 includes slurry particles 450 and chemistry providing certain chemical and mechanical properties thereto. Thus, an aqueous slurry 350 may be configured for a particular planarization application, depending on the material of the semiconductor wafer 300 to be planarized.

During a planarization application, the hydrophobic CMP pad 250 is moved in a given direction (see arrow 375), generally in a rotable manner. Similarly, the semiconductor wafer 300 to be planarized is positioned above the hydrophobic CMP pad 250 and moved in an opposite direction to that of the hydrophobic CMP pad 250 (see arrow 380), generally also in a rotable manner. In this manner, shearing forces are applied from the hydrophobic CMP pad 250 to the surface 430 of the semiconductor wafer 300 for planarization as indicated at 760.

The effects of the shearing forces described above are illustrated with particular reference to FIGS. 4 and 5. In the embodiment shown, the semiconductor wafer 300 includes a metal line 420 between dielectric material 410. A planarization application is applied to the semiconductor wafer 300 to remove excess metal 425. In this embodiment, planarization is used to isolate the metal line 420 as shown in FIG. 5. That is, the surface 430 of the semiconductor wafer 300 is planarized and reduced from the position shown in FIG. 4 to that shown in FIG. 5 during a planarization application. As shown in FIG. 5, the metal line 420 is now entirely isolated between dielectric material 410 of the semiconductor wafer 300. Planarization may also be used in other embodiments for removal of other material types, including dielectric materials, in other applications.

Throughout the planarization process described above, the hydrophobic CMP pad 250 substantially retains reliable wear, shearing, hardness, water absorption, electrical and other planarization characteristics. This is because the material of the hydrophobic CMP pad 250 is tailored as described above with a degree of hydrophobicity necessary to prevent any substantial intake of aqueous slurry 350. That is, the aqueous slurry 350 is substantially prevented from crossing the surface 475 of the hydrophobic CMP pad 250. In this manner, the hydrophobic CMP pad 250 maintains reliable physical characteristics as noted above while also maintaining a stable electrical character, unaffected by any significant uptake of a liquid media such as the aqueous slurry 350. Additionally, pores 460 throughout the hydrophobic CMP pad 250 remain substantially void further stabilizing its character.

Referring to FIGS. 6 and 7, embodiments of forming and using a hydrophobic CMP pad are summarized in the form of flow-charts as previously indicated. With particular reference to FIG. 6, an organic polymer is mixed with a metal agent to form the initial liquid CMP material as indicated at 620. As shown at 630, a curing agent is then added to the CMP material which may be followed by application of reduced pressure and elevated heat as indicated at 635. An inert gas is then dissolved into the CMP material as indicated at 640. As shown at 650 a cured and solidified CMP log may then be removed and sawed into individual hydrophobic CMP pads as shown at 660. With particular reference to FIG. 7, a hydrophobic CMP pad may be provided as indicated at 730 for the planarization of a semiconductor wafer. An aqueous slurry may be applied to the hydrophobic CMP pad as indicated at 740. However, as described above, the hydrophobic CMP pad is able to avoid significant uptake of the aqueous slurry and substantially maintain its physical and electrical characteristics. Therefore, a semiconductor wafer may be positioned above the hydrophobic CMP pad as shown at 750 and planarized as indicated at 760 in a reliable and predictable manner throughout the planarization process.

Embodiments described above may substantially prevent intake of aqueous slurry by a CMP pad during a planarization application. As a result, wear, hardness, shearing, electrical and other characteristics of the CMP pad remain fairly constant throughout the planarization. Therefore, planarization applications may be established with a high degree of precision due to the reliable character and performance of the CMP pad.

While the above embodiments are described with reference to a particulate hydrophobic CMP pad, method of manufacture, and use, other embodiments and features may be employed. For example, the metal agent incorporated into the CMP material may be selected in light of metal features of the semiconductor wafer to be planarized. That is, where copper metal lines are to be isolated within the semiconductor wafer during planarization, the metal agent may include copper. Thus, the effect of any metal leeching from the CMP pad may be substantially minimized. Additionally, various other features and methods may be employed which are within the scope of the described embodiments.

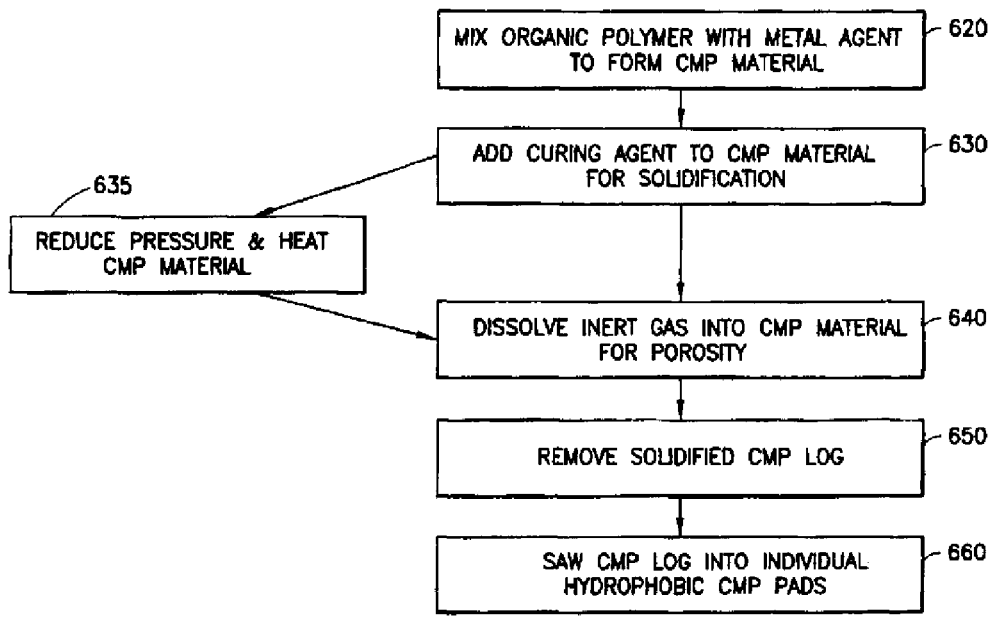

I claim:

1. A hydrophobic chemical mechanical planarization (HCMP) pad comprising:
   an organic polymer; and
   a metal agent, wherein the metal agent includes at least one β-diketonate ligand,
   wherein the metal agent includes one of cobalt, palladium, nickel, titanium, zirconium, hafnium, and copper, and wherein the pad is useful for planarizing a semiconductor wafer.

2. The HCMP pad of claim 1 wherein said organic polymer comprises one of a polyurethane or a polyether based material.

3. The HCMP pad of claim 1 wherein said organic polymer is formed of a polyol and di-isocyanate.

4. The HCMP pad of claim 1 wherein said organic polymer is reactive with one of a polyfunctional amine, a diamine, a triamine, a polyfunctional hydroxyl, and a mixed functionality hydroxylamine.

5. The HCMP pad of claim 1 further comprising a matrix material selected from the group consisting of a urethane, a melamine, a polyester, a polysulfone, polyvinyl acetate, a fluorinated hydrocarbon, and mixtures and copolymers thereof.

6. The HCMP pad of claim 1 wherein the HCMP pad further comprises pores.

7. The HCMP pad of claim 1 wherein the α-diketonate ligand includes a side group selected from hydrogen, an aryl, a perfluoraryl, an alkyl, a perfluoroalkyl, and a t-butyl group.

8. The HCMP pad of claim 1 wherein a metal feature on the semiconductor wafer is isolated during planarization.

9. The HCMP pad of claim 1 wherein said metal agent includes a metal compatible with a metal of the metal feature.

10. The HCMP pad of claim 1, wherein said pad substantially retains a planarization characteristic during the planarization.

11. The HCMP pad of claim 10 wherein the planarization characteristic is one of shearing, hardness, wearing, cross-linking, water uptake and electrical character.

12. The HCMP pad of claim 1, wherein said pad substantially avoids uptake of aqueous slurry during the planarization.

13. The HCMP pad of claim 1 wherein said organic polymer comprises a urethane.

14. The HCMP pad of claim 1 wherein the metal agent includes a side group selected from an aryl, a perfluoraryl, an alkyl, a perfluoroalkyl, and a t-butyl group.

15. The HCMP pad of claim 1 wherein the metal agent further includes at least one additional ligand comprising the formula —OR, wherein R is selected from the group consisting of hydrogen, an aryl, an alkyl, a perfluoraryl, a perfluoroalkyl, and combinations thereof.

16. A method comprising mixing an organic polymer and a metal agent to form a chemical mechanical planarization (CMP) pad, wherein the metal agent includes at least one β-diketonate ligand, and wherein the metal agent includes one of cobalt, palladium, nickel, titanium, zirconium, hafnium, and copper.

17. The method of claim 16 further comprising:
   adding a foaming agent and a curing agent to the organic polymer and metal agent to form a CMP material;
   reducing pressure around the CMP material; and
   heating the CMP material to form the CMP pad.

18. The method of claim 17 further comprising obtaining a hydrophobic CMP pad from a log formed of the CMP material.

19. A method of fabricating a semiconductor device, said method comprising:
   providing a hydrophobic chemical mechanical planarization (HCMP) pad according to claim 1; and
   planarizing the semiconductor device with the HCMP pad during the fabrication of said device.

20. The method of claim 19 wherein the planarizing further comprises:
   delivering an aqueous slurry to a surface of the HCMP pad;
   moving the HCMP pad in a first direction; and
   moving the semiconductor device in a second direction different from the first direction.

21. The method of claim 16, wherein the metal agent is dissolved in an organic solvent.

22. The method of claim 16, wherein the HCMP pad further comprises pores.

23. The method of claim 16, wherein the α-diketonate ligand includes a side group selected from hydrogen, an aryl, a perfluoraryl, an alkyl, a perfluoroalkyl, and a t-butyl group.

24. The method of claim 16, wherein the metal agent further includes at least one additional ligand comprising the formula —OR, wherein R is selected from the group consisting of hydrogen, an aryl, an alkyl, a perfluoraryl, a perfluoroalkyl, and combinations thereof.

* * * * *

UNITED STATES PATENT AND TRADEMARK OFFICE
CERTIFICATE OF CORRECTION

| | | |
|---|---|---|
| PATENT NO. | : 7,335,239 B2 | |
| APPLICATION NO. | : 10/715246 | |
| DATED | : February 26, 2008 | |
| INVENTOR(S) | : Thomas H. Baum | |

It is certified that error appears in the above-identified patent and that said Letters Patent is hereby corrected as shown below:

In column 5, please change line 1 of claim 7 to:
"The HCMP pad of claim 1 wherein the "ß-diketonate"

Please delete claim 14. It was previously cancelled.

In column 6, please change line 1 of claim 23 to:
"The method of claim 16, wherein the ß-diketonate"

Signed and Sealed this
Twenty-seventh Day of March, 2012

David J. Kappos
*Director of the United States Patent and Trademark Office*

UNITED STATES PATENT AND TRADEMARK OFFICE
CERTIFICATE OF CORRECTION

PATENT NO. : 7,335,239 B2
APPLICATION NO. : 10/715246
DATED : February 26, 2008
INVENTOR(S) : Thomas H. Baum It is certified that error appears in the above-identified patent and that said Letters Patent is hereby corrected as shown below:

Delete the title page and substitute therefore the attached title page showing the corrected number of claims in patent.

Column 5, line 63 (Claim 7, line 1) please change to:
"The HCMP pad of claim 1 wherein the "ß-diketonate"

Column 6, lines 17-19, please delete claim 14. It was previously cancelled.

Column 6, line 56 (Claim 23, line 1) please change to:
"The method of claim 16, wherein the ß-diketonate"

This certificate supersedes the Certificate of Correction issued March 27, 2012.

Signed and Sealed this
Seventeenth Day of April, 2012

David J. Kappos
*Director of the United States Patent and Trademark Office*